US011735538B2

(12) United States Patent
Radulescu

(10) Patent No.: US 11,735,538 B2
(45) Date of Patent: Aug. 22, 2023

(54) SEMICONDUCTOR HAVING A BACKSIDE WAFER CAVITY FOR RADIO FREQUENCY (RF) PASSIVE DEVICE INTEGRATION AND/OR IMPROVED COOLING AND PROCESS OF IMPLEMENTING THE SAME

(71) Applicant: Cree, Inc., Durham, NC (US)

(72) Inventor: Fabian Radulescu, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 27 days.

(21) Appl. No.: 16/792,633

(22) Filed: Feb. 17, 2020

(65) Prior Publication Data
US 2021/0257320 A1    Aug. 19, 2021

(51) Int. Cl.
*H01L 23/66*    (2006.01)
*H01L 25/16*    (2023.01)
(Continued)

(52) U.S. Cl.
CPC ........ *H01L 23/66* (2013.01); *H01L 21/30604* (2013.01); *H01L 23/473* (2013.01); *H01L 23/528* (2013.01); *H01L 23/5226* (2013.01); *H01L 25/16* (2013.01); *H01L 29/2003* (2013.01); *H01L 29/205* (2013.01); *H01L 29/66462* (2013.01); *H01L 29/7786* (2013.01); *H03F 3/193* (2013.01); *H01L 2223/6616* (2013.01); *H01L 2223/6672* (2013.01); *H03F 2200/451* (2013.01)

(58) Field of Classification Search
CPC ....... H01L 23/66; H01L 25/16; H01L 23/528; H01L 23/5226; H01L 29/7786; H01L 29/66462; H01L 23/473; H01L 29/2003; H01L 29/205; H01L 21/30604; H01L 21/486; H01L 21/4853; H01L 21/78; H01L 23/49827; H01L 23/49833; H01L 25/0652; H01L 25/50; H01L 21/4882; H01L 21/56; H01L 23/3107; H01L 23/367; H01L 23/552; H01L 23/3128; H01L 23/49822; H01L 24/32; H01L 21/563; H01L 25/18; H01L 23/5383; H01L 23/5386; H01L 24/09; H01L 24/17; H01L 24/49; H01L 24/73; H01L 23/36; H03F 3/193; H01P 1/203; H01P 3/08; H01P 5/12; H05K 1/185
USPC ........ 257/736, 686, 700, 723, 724, E21.499, 257/E25.027; 438/125, 108, 109; 361/761, 736, 728, 794, 818, 764, 719, 361/780
See application file for complete search history.

(56) References Cited

U.S. PATENT DOCUMENTS 6,445,591 B1 * 9/2002 Kwong ............... H01L 25/0652
257/686
9,761,547 B1 * 9/2017 Kunkee ............... H01L 23/5385
(Continued)

*Primary Examiner* — Mouloucoulaye Inoussa
(74) *Attorney, Agent, or Firm* — BakerHostetler

(57) ABSTRACT

A semiconductor device configured for a radio frequency (RF) application and further configured for passive device integration and/or improved cooling includes a substrate; an active region portion arranged on the substrate, the active region portion includes at least one radio frequency (RF) transistor amplifier; a cavity arranged within the substrate; and one or more radio frequency (RF) devices arranged in the cavity.

33 Claims, 13 Drawing Sheets

(51) Int. Cl.
*H01L 23/528* (2006.01)
*H01L 23/522* (2006.01)
*H01L 29/778* (2006.01)
*H01L 29/66* (2006.01)
*H01L 23/473* (2006.01)
*H01L 29/20* (2006.01)
*H01L 29/205* (2006.01)
*H03F 3/193* (2006.01)
*H01L 21/306* (2006.01)

(56) References Cited

U.S. PATENT DOCUMENTS

| | | | | |
|---|---|---|---|---|
| 2008/0192443 | A1* | 8/2008 | Hatanaka | H01L 24/97 361/728 |
| 2008/0283992 | A1* | 11/2008 | Palaniappan | H01L 25/105 257/686 |
| 2010/0327419 | A1* | 12/2010 | Muthukumar | H01L 25/105 257/686 |
| 2014/0062607 | A1* | 3/2014 | Nair | H01L 23/5389 331/68 |
| 2016/0035679 | A1* | 2/2016 | Chen | H01L 21/52 361/736 |
| 2017/0047308 | A1* | 2/2017 | Ho | H01L 23/5386 |
| 2017/0185107 | A1* | 6/2017 | Kwon | G06F 1/1635 |
| 2017/0373035 | A1* | 12/2017 | Seol | H01L 25/18 |
| 2020/0020643 | A1* | 1/2020 | Yu | H01L 23/49822 |
| 2020/0105663 | A1* | 4/2020 | Tsai | H01L 24/14 |
| 2020/0243497 | A1* | 7/2020 | Hsu | H01L 21/4857 |
| 2020/0273718 | A1* | 8/2020 | Cheng | H01L 21/561 |

\* cited by examiner

SEMICONDUCTOR HAVING A BACKSIDE WAFER CAVITY FOR RADIO FREQUENCY (RF) PASSIVE DEVICE INTEGRATION AND/OR IMPROVED COOLING AND PROCESS OF IMPLEMENTING THE SAME

FIELD OF THE DISCLOSURE

The disclosure relates to a semiconductor having a backside wafer cavity for radio frequency (RF) passive device integration. The disclosure further relates to a semiconductor having a backside wafer cavity for improved cooling. The disclosure further relates to a semiconductor having a backside wafer cavity for radio frequency (RF) passive device integration and improved cooling.

The disclosure further relates to a process of implementing a semiconductor having a backside wafer cavity for radio frequency (RF) passive device integration. The disclosure further relates to a process of implementing a semiconductor having a backside wafer cavity for improved cooling. The disclosure further relates to a process of implementing a semiconductor having a backside wafer cavity for radio frequency (RF) passive device integration and improved cooling.

BACKGROUND OF THE DISCLOSURE

Electrical circuits requiring high power handling capability while operating at high frequencies, such as radio frequencies (500 MHz), S-band (3 GHz), X-band (10 GHz), K-band (18 to 27 GHz), and other high frequencies have in recent years become more prevalent. Because of the increase in high power and/or high frequency circuits, there has been a corresponding increase in demand for semiconductor devices which are capable of reliably operating at radio and microwave frequencies while still being capable of handling high power loads.

The electrical circuit implementing the semiconductor devices often include one or more devices connecting to the semiconductor devices. These devices may be passive devices connecting to the semiconductor devices to provide various functionality, such as network matching. However, these devices consume a substantial area in the electrical circuit and often require complex and costly manufacturing techniques. Moreover, these devices are typically arranged separately from the semiconductor devices. However, this arrangement limits effectiveness of the electrical circuit due to parasitic effects, cross coupling effects, and other effects that influence the propagation of the signals between the semiconductor devices and the devices as well as other problems. This issue becomes particularly problematic as the complexity and component count of the electrical circuit increases.

Additionally, to provide increased output power, semiconductor devices have been developed that include a plurality of "unit cell" transistors that are formed on a common semiconductor structure and that are electrically connected in parallel. Each unit cell transistor may include a gate finger that extends in parallel between elongated source and drain contacts. However, the plurality of "unit cell" transistors formed on the common semiconductor structure requiring high power handling capability while operating at high frequencies generate substantial heat that impacts a performance of the electrical circuit.

Accordingly, there is a need to implement processes and devices to improve performance of passive devices for electrical circuits implementing semiconductor devices. Moreover, there is a need to implement processes and devices to address heat buildup in electrical circuits. Additionally, there is a need to implement processes and devices to improve performance of radio frequency (RF) passive devices for radio frequency (RF) electrical circuits implementing radio frequency (RF) semiconductor devices. Moreover, there is a need to implement processes and devices to address heat buildup in radio frequency (RF) electrical circuits.

SUMMARY OF THE DISCLOSURE

One aspect includes a semiconductor device configured for a radio frequency (RF) application that includes: a substrate; an active region portion arranged on the substrate that includes at least one radio frequency (RF) transistor amplifier; a cavity arranged within the substrate; and one or more radio frequency (RF) devices arranged in the cavity.

One aspect includes a process of implementing a semiconductor device configured for a radio frequency (RF) application that includes: forming a substrate; forming an active region portion on the substrate that includes at least one radio frequency (RF) transistor amplifier etching a cavity within the substrate; and forming one or more radio frequency (RF) devices in the cavity.

One aspect includes a semiconductor device configured for a radio frequency (RF) application that includes: a substrate; an active region portion arranged on the substrate that includes at least one radio frequency (RF) transistor amplifier a cavity arranged within the substrate; and the cavity configured to receive a cooling medium to transfer heat from the substrate.

One aspect includes a semiconductor device configured for a radio frequency (RF) application and further configured for passive device integration and/or improved cooling that includes a substrate; an active region portion arranged on the substrate, the active region portion that includes at least one radio frequency (RF) transistor amplifier; a cavity arranged within the substrate; one or more radio frequency (RF) devices arranged in the cavity; and an electrical path that extends from one or more radio frequency (RF) devices through the substrate to the active region portion.

One aspect includes a process of implementing a semiconductor device configured for a radio frequency (RF) application and further configured for passive device integration and/or improved cooling that includes forming a substrate; forming an active region portion on the substrate, the active region portion that includes at least one radio frequency (RF) transistor amplifier; etching a cavity within the substrate; forming one or more radio frequency (RF) devices in the cavity; and forming an electrical path that extends from one or more radio frequency (RF) devices through the substrate to the active region portion.

One aspect includes a semiconductor device configured for a radio frequency (RF) application includes: a substrate; an active region portion arranged on the substrate, the active region portion includes at least one radio frequency (RF) transistor amplifier; a back side cavity arranged within the substrate; one or more radio frequency (RF) devices configured to be implemented as integrated passive devices (IPDs) arranged in the back side cavity; one or more connections to the one or more radio frequency (RF) devices that extend from an upper surface through the substrate to the one or more radio frequency (RF) devices; one or more secondary connections that extend from the one or more connections to the active region portion; and an electrical connection that extends within the back side cavity to the one or more radio frequency (RF) devices.

One aspect includes a process of implementing a semiconductor device configured for a radio frequency (RF) application includes: forming a substrate; forming an active region portion on the substrate, the active region portion includes at least one radio frequency (RF) transistor amplifier; etching a back side cavity within the substrate; forming one or more radio frequency (RF) devices as integrated passive devices (IPDs) in the back side cavity; forming one or more connections to the one or more radio frequency (RF) devices that extend from an upper surface through the substrate to the one or more radio frequency (RF) devices; forming one or more secondary connections that extend from the one or more connections to the active region portion; and forming an electrical connection that extends within the back side cavity to the one or more radio frequency (RF) devices.

In one or more aspects the IPDs may implement or support various functional technology as input, output, and/or intrastage functions to the active region, an RF circuit, and/or the like.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
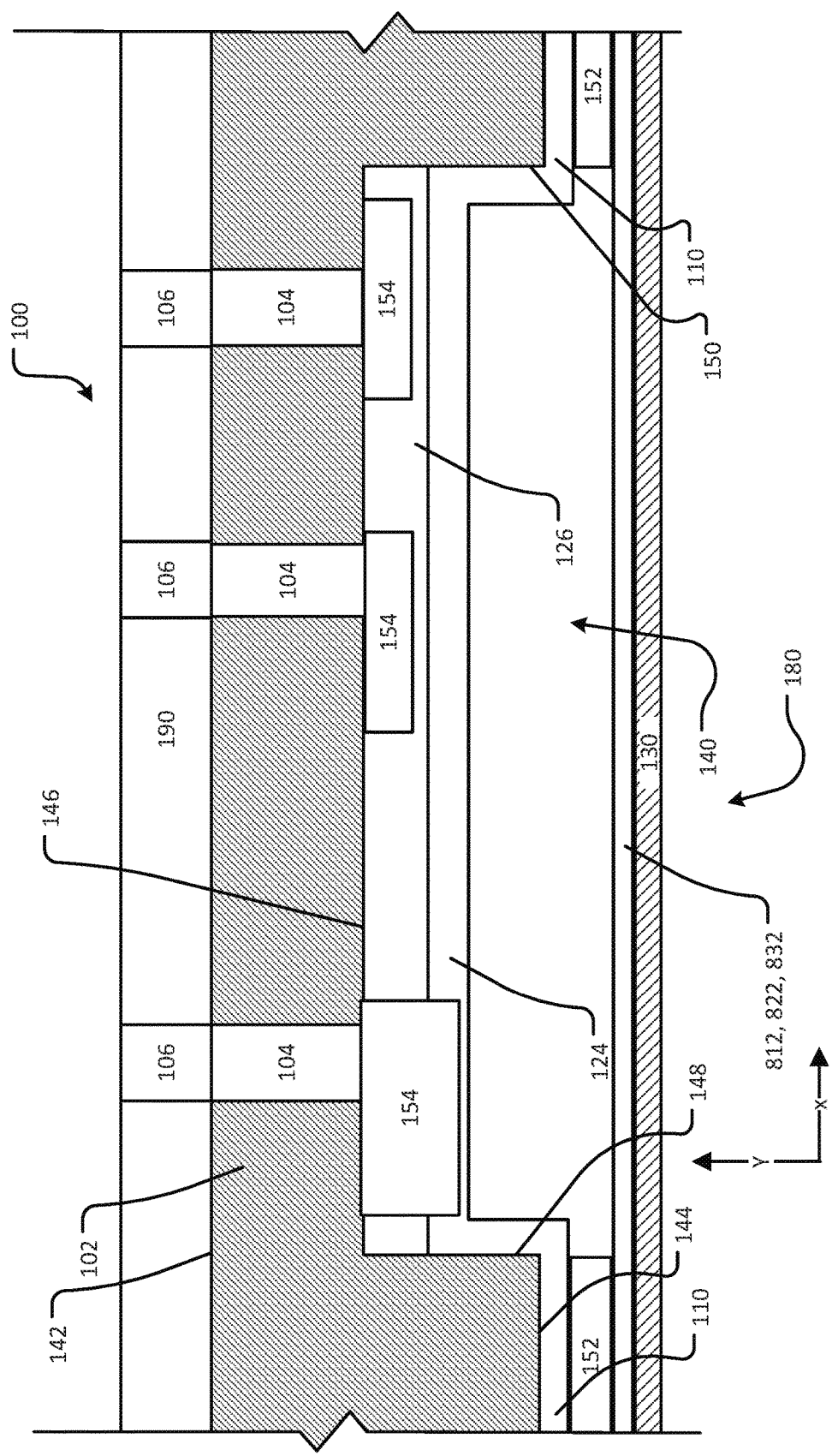
FIG. 1 illustrates a partial cross-sectional view of one aspect of a semiconductor device according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosed implementation avoids the drawbacks of circuit board level techniques for selective processing of signals, such as increased area and decreased effectiveness due to the distance from an active region portion and/or the semiconductor device. Moreover, the disclosed configuration avoids the drawbacks of package level processing techniques that rely on complex networks of bonding wires and discrete passive components (e.g. chip capacitors), such as parasitic effects, cross-coupling effects, and other effects. By arranging the one or more devices within a back side cavity may, that may be implemented as integrated passive devices (IPD), many bond wires that are susceptible to parasitic effects, cross-coupling effects, and other effects may be eliminated from the semiconductor device. Additionally, arranging the one or more devices within a back side cavity may reduce an area needed for implementation of the semiconductor device.

Moreover, the disclosed implementation provides increased cooling for an active region portion and/or the semiconductor device. This increased cooling increases reliability of the semiconductor device while operating at radio and microwave frequencies and/or while handling high power loads. Additional benefits provided by this disclosure are further contemplated and/or described herein.

FIG. 1 illustrates a partial cross-sectional view of one aspect of a semiconductor device according to the disclosure.

Figure 6:
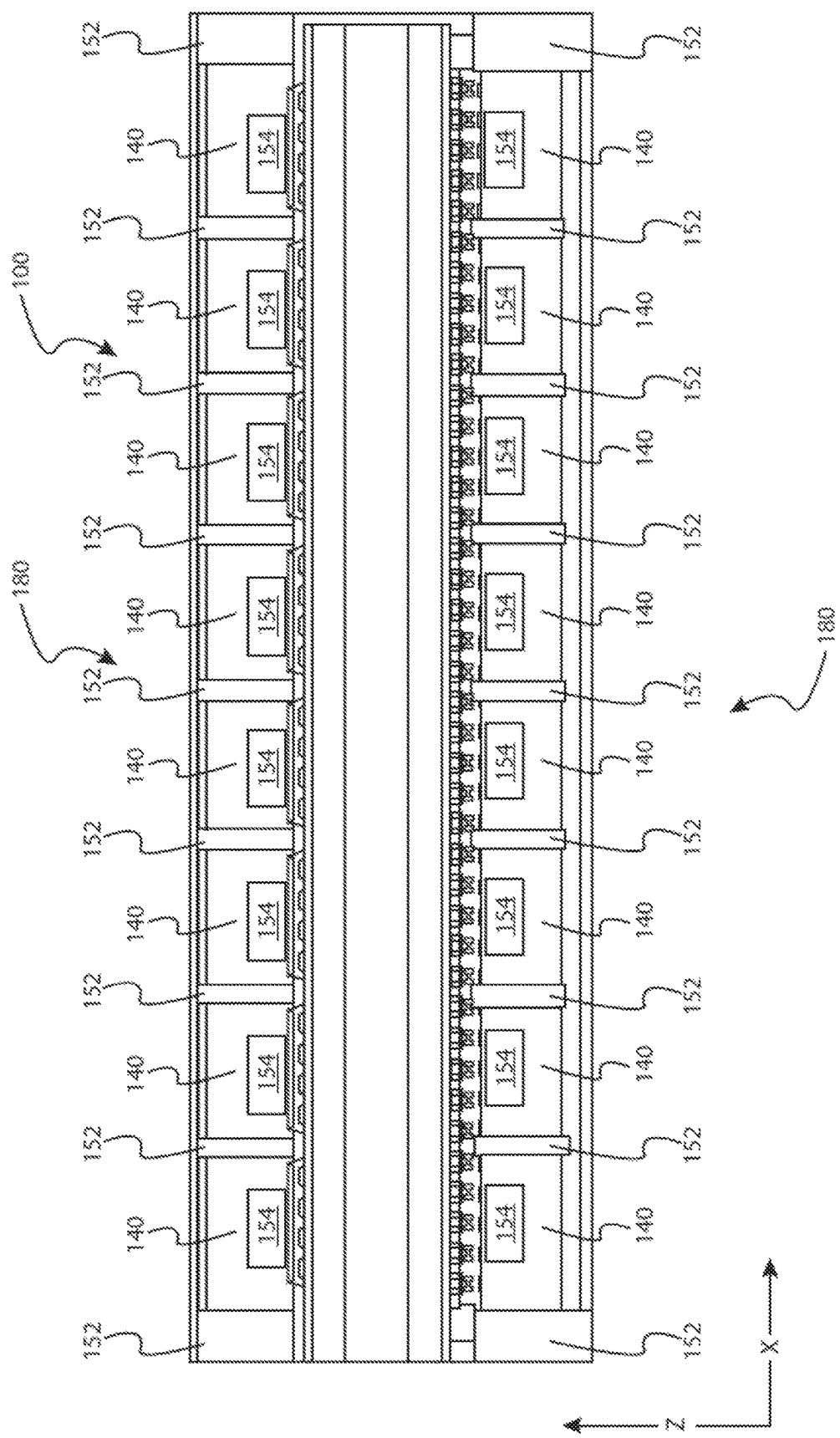
FIG. 6 illustrates a bottom view of one aspect of a semiconductor device according to the disclosure.

In particular, FIG. 1 illustrates a partial cross-sectional view of a semiconductor device 100. The semiconductor device 100 may be configured in a radio frequency (RF) application, may be configured as a radio frequency (RF) device, may be configured for radio frequency (RF) implementations, and/or the like. The semiconductor device 100 may include a support 130 implemented as described herein. More specifically, FIG. 1 illustrates a portion 180 of the semiconductor device 100 and the semiconductor device 100 may have a plurality of such portions 180 along an x-axis as illustrated in FIG. 6 and/or a plurality of such portions 180 along a z-axis as illustrated in FIG. 6. The semiconductor device 100 may include a substrate 102 or wafer and an active region portion 190. The substrate 102 and the active region portion 190 may extend along the x-axis and the z-axis as illustrated in FIG. 6. However, the semiconductor device 100 may be implemented utilizing other configurations. In particular, the semiconductor device 100 may implement other three-dimensional heterogeneous type integrations.

The active region portion 190 may include or partially include one or more power amplifier transistors, single path radio frequency (RF) power transistors, single stage radio frequency (RF) power transistors, multipath radio frequency (RF) power transistors, multistage radio frequency (RF) power transistors, gallium nitride (GaN) based radio frequency (RF) power amplifier modules, laterally-diffused metal-oxide semiconductor (LDMOS) devices, LDMOS radio frequency (RF) power amplifier modules, radio frequency (RF) power devices, ultra-wideband devices, GaN based devices, Metal Semiconductor Field-Effect Transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) semiconductors, and/or the like.

The substrate 102 may be made of silicon carbide (SiC), gallium arsenide (GaAs), GaN, sapphire, spinel, zinc oxide (ZnO), silicon, or other material suitable for radio frequency (RF) applications described herein. The substrate 102 may include an upper surface 142, a lower surface 144, an intermediate surface 146 for each portion 180, a first inner side surface 148 for each portion, and a second inner side surface 150 for each portion. The upper surface 142, the lower surface 144, and the intermediate surface 146 may be generally parallel with respect to the x-axis as shown in FIG. 1. The first inner side surface 148 and the second inner side surface 150 may be generally parallel with respect to a y-axis as shown in FIG. 1. In this regard, generally parallel may be defined as being within 1°-20° of parallel of the referenced axis.

The lower surface 144, the intermediate surface 146, the first inner side surface 148, and/or the second inner side surface 150 of the substrate 102 may be configured to form and define a back side cavity 140. The back side cavity 140 may be implemented in one or more of the portions 180 as illustrated in FIG. 6. The back side cavity 140 may be formed by etching or similar processes as described in further detail herein. However, the back side cavity 140 described herein could be implemented as a cavity and used in a variety of locations, orientations, and/or positions in the substrate 102 and/or the semiconductor device 100.

The back side cavity 140 may be configured to receive one or more devices 154. The one or more devices 154 may be implemented as one or more resistors, one or more capacitors, one or more inductors, one or more resistor circuits, one or more capacitor circuits, one or more inductor circuits, and/or the like. The one or more devices 154 may be implemented as an integrated passive devices (IPD) and/or Integrated Passive Components (IPC). The one or more devices 154 implemented as IPDs may implement or support various radio frequency (RF) passive devices. The one or more devices 154 implemented as IPDs may implement or support various functional technology including providing one or more of resistance, inductance, capacitance, impedance matching circuits, matching circuits, input matching circuits, output matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, and the like. The one or more devices 154 implemented as IPDs may implement or support various functional technology as input, output, and/or intrastage functions to the active region, an RF circuit, and/or the like.

Generally speaking, the one or more devices 154 implemented as an IPD may refer to implementations that they include an integrated circuit, which may be semiconductor based, and may include a number of passive devices integrally formed within the semiconductor device 100 and connected to the active region portion 190. A custom circuit topology may be provided by the IPD. A variety of different structures may be fabricated within semiconductor device 100 to provide the necessary processing, frequency response, and the like of a specified passive component. The one or more devices 154 implemented as an IPD may be used to provide some or all of the passive components for an impedance matching circuit, a matching circuit, an input matching circuit, an output matching circuit, a harmonic filter, a harmonic termination, a coupler, a balun, a power combiner, a power divider, a radio frequency (RF) circuit, a radial stub circuit, a transmission line circuit, a fundamental frequency matching circuit, a baseband termination circuit, a second order harmonic termination circuit, and the like.

The semiconductor device 100 may include one or more connections 104 to the one or more devices 154. In particular, the semiconductor device 100 may include one or more connections 104 to the one or more devices 154 that may extend from upper surface 142 through the substrate 102 to the one or more devices 154. The one or more connections 104 may be implemented by one or more vias. Any number of the one or more connections 104, such as vias, may be implemented as needed to connect to the one or more devices 154. In one aspect, there may be N number of the vias, where N is a positive integer. The vias may be metallic plated holes, such as copper-plated holes, aluminum-plated holes, silver-plated holes, gold-plated holes, and/or the like, that may function as electrical tunnels through the substrate 102. Additionally, the one or more connections 104 may utilize other types of connection technology including one or more wires, leads, edge platings, circuit traces, tracks, clips, and/or the like.

Moreover, each of the one or more connections 104 that may be implemented by one or more vias may further include one or more secondary connections 106 to the active region portion 190. The one or more secondary connections 106 may utilize any type of connection technology including one or more vias, wires, leads, edge platings, circuit traces, tracks, clips, and/or the like. The one or more secondary connections 106 may utilize an adhesive, soldering, sintering, eutectic bonding, ultrasonically welding, and/or the like as described herein.

The semiconductor device 100 may include at least one connection 110. The at least one connection 110 may be a connection to a source, a drain, a gate, or the like of the active region portion 190. The at least one connection 110 may extend along the lower surface 144 of the substrate 102. Additionally, the at least one connection 110 may connect to a portion 152. The portion 152 may be a patterned solder metal portion, a solder portion, an adhesive portion, a sintered portion, a eutectic bonded portion, an ultrasonically welded portion, and/or the like. The portion 152 may connect to a source, a drain, a gate, or the like of the active region portion 190. In some aspects, the portion 152 may connect directly or indirectly to a gate pad 812, a source pad 822, or a drain pad 832.

The substrate 102 may be mounted on an upper surface of the support 130. The substrate 102 may be mounted on the upper surface of the support 130 by an adhesive, soldering, sintering, eutectic bonding, ultrasonically welding, and/or the like as described herein. In one aspect, the substrate 102 may be mounted on the upper surface of the support 130 by the portion 152. In one aspect, the substrate 102 may be directly mounted on the upper surface of the support 130. In one aspect, the substrate 102 may be mounted on the upper surface of the support 130 with other intervening structures, components, and/or the like.

The support 130 may be implemented as a printed circuit board (PCB), a ceramic component, a glass component, a low temperature co-fired ceramic (LTCC) component, a high temperature co-fired ceramic (HTCC) component, a thick film substrate component, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 130 may include an insulating material, a dielectric material, electrical traces, electrical tracks, and/or the like.

The semiconductor device 100 may include an electrical connection 124 and an insulating material 126. The electrical connection 124 may extend from the at least one connection 110 along the lower surface 144 and the first inner side surface 148 within the back side cavity 140 to the one or more devices 154. The electrical connection 124 may also extend from the at least one connection 110 along the second inner side surface 150 within the back side cavity 140 to the one or more devices 154. The electrical connection 124 may include the at least one connection 110; or the electrical connection 124 may be implemented separate from the at least one connection 110.

Accordingly, the electrical connection 124 may provide an electrical connection between the one or more devices 154, the at least one connection 110, and/or the portion 152 for providing signaling, power, receiving signaling, receiving power, and the like between the one or more devices 154, the support 130, and/or the active region portion 190.

Additionally, the electrical connection 124 arranged in the back side cavity 140 may be implemented with a plurality of the electrical connection 124. In this regard, there may be a plurality of the electrical connection 124 for each of the one or more devices 154; or there may be a plurality of the electrical connection 124 with one or more for each of the one or more devices 154. The electrical connection 124 may be formed utilizing patterned back side metal layers as described in further detail herein.

The insulating material 126 may be arranged between the intermediate surface 146 and the electrical connection 124. The one or more devices 154 may be covered completely by the insulating material 126, the one or more devices 154 may be completely encapsulated by the insulating material 126, the one or more devices 154 may be partially covered by the insulating material 126, and/or the like as illustrated in FIG. 1. The insulating material 126 may include SiN, AlO, SiO, $SiO_2$, AlN, or the like, or a combination incorporating multiple layers thereof. The insulating material 126 can be deposited using Metalorganic Chemical Vapor Deposition (MOCVD) processes, plasma chemical vapor deposition (CVD) processes, hot-filament CVD processes, sputtering processes, and/or the like. In one aspect, the insulating material 126 forms an insulating layer. In one aspect, the insulating material 126 forms an insulator. In one aspect, the insulating material 126 may be a dielectric.

The disclosed implementation avoids the drawbacks of circuit board level techniques for selective processing, such as increased area and decreased effectiveness due to the distance from the active region portion 190 and/or the semiconductor device 100. Moreover, the disclosed implementations avoid the drawbacks of package level selective processing techniques that rely on complex networks of bonding wires and discrete passive components (e.g. chip capacitors), such as parasitic effects, cross-coupling effects, and other effects. By arranging the one or more devices 154 within a back side cavity many bond wires that are susceptible to parasitic effects, cross-coupling effects, and other effects are eliminated from the semiconductor device 100. Arranging the one or more devices 154 within the back side cavity 140 additionally may reduce an area needed for implementation of the semiconductor device 100.

Figure 2:
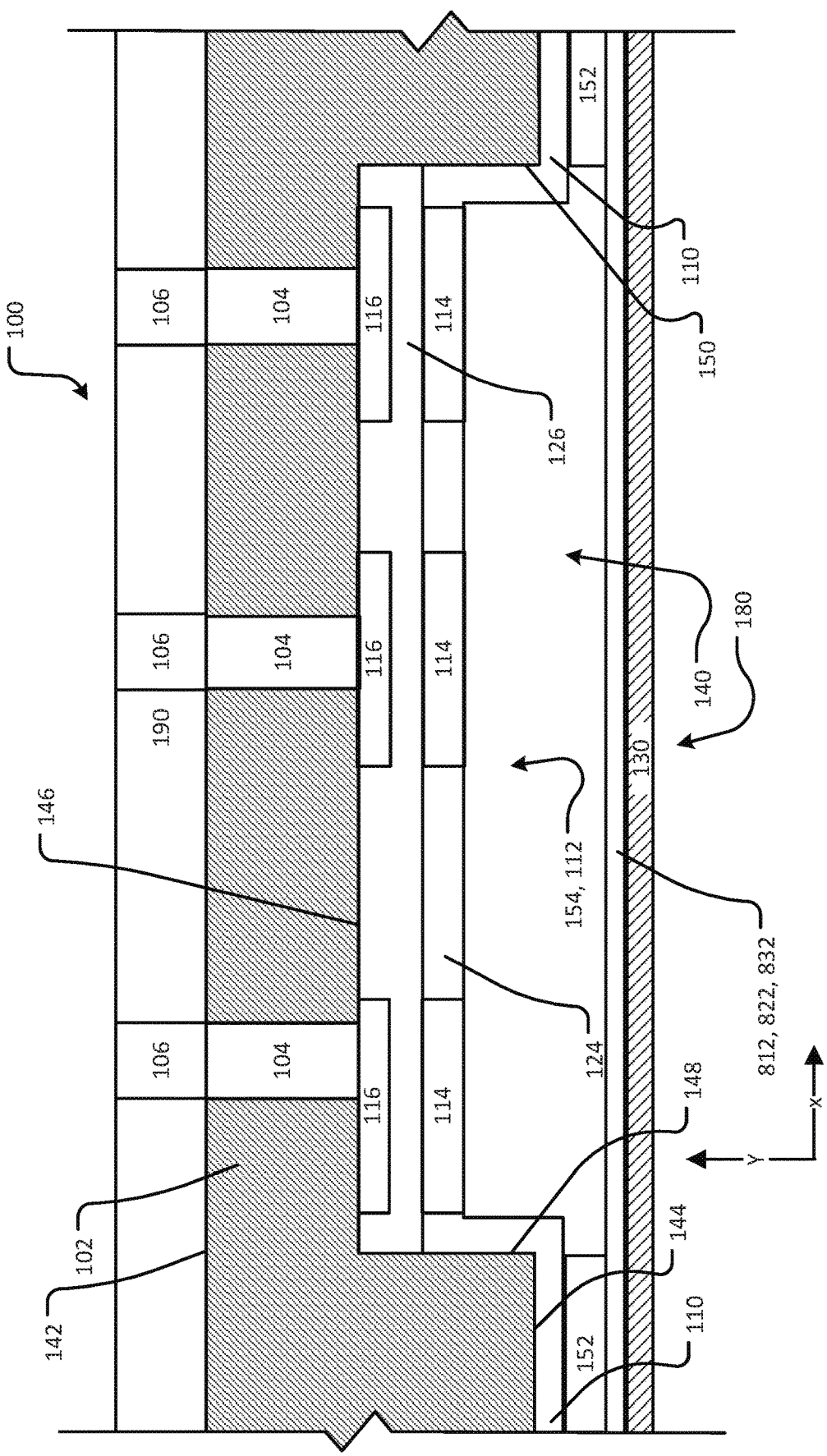
FIG. 2 illustrates a partial cross-sectional view of one aspect of a semiconductor device according to the disclosure.

FIG. 2 illustrates a partial cross-sectional view of one aspect of a semiconductor device according to the disclosure.

In particular, FIG. 2 is a semiconductor device 100 that may include any one or more of the features, components, configurations, and the like of the disclosure. The semiconductor device 100 may include the one or more devices 154 implemented as at least one capacitor 112. As illustrated in FIG. 2, the at least one capacitor 112 includes three capacitors. However, any number of capacitors may be implemented.

The at least one capacitor 112 may include a first plate structure 114 and a second plate structure 116. The second plate structure 116 may connect to one of the one or more connections 104 as illustrated in FIG. 2 and the connection may form a terminal to the second plate structure 116 of the at least one capacitor 112. The first plate structure 114 may connect to the electrical connection 124 and the connection may form a terminal to the first plate structure 114. However, the at least one capacitor 112 may be implemented with other constructions. When an electric potential, a voltage, and/or the like is applied across the terminals of the at least one capacitor 112, an electric field may develop across the insulating material 126, causing a net positive charge to collect on one plate structure and net negative charge to collect on the other plate structure.

Figure 3:
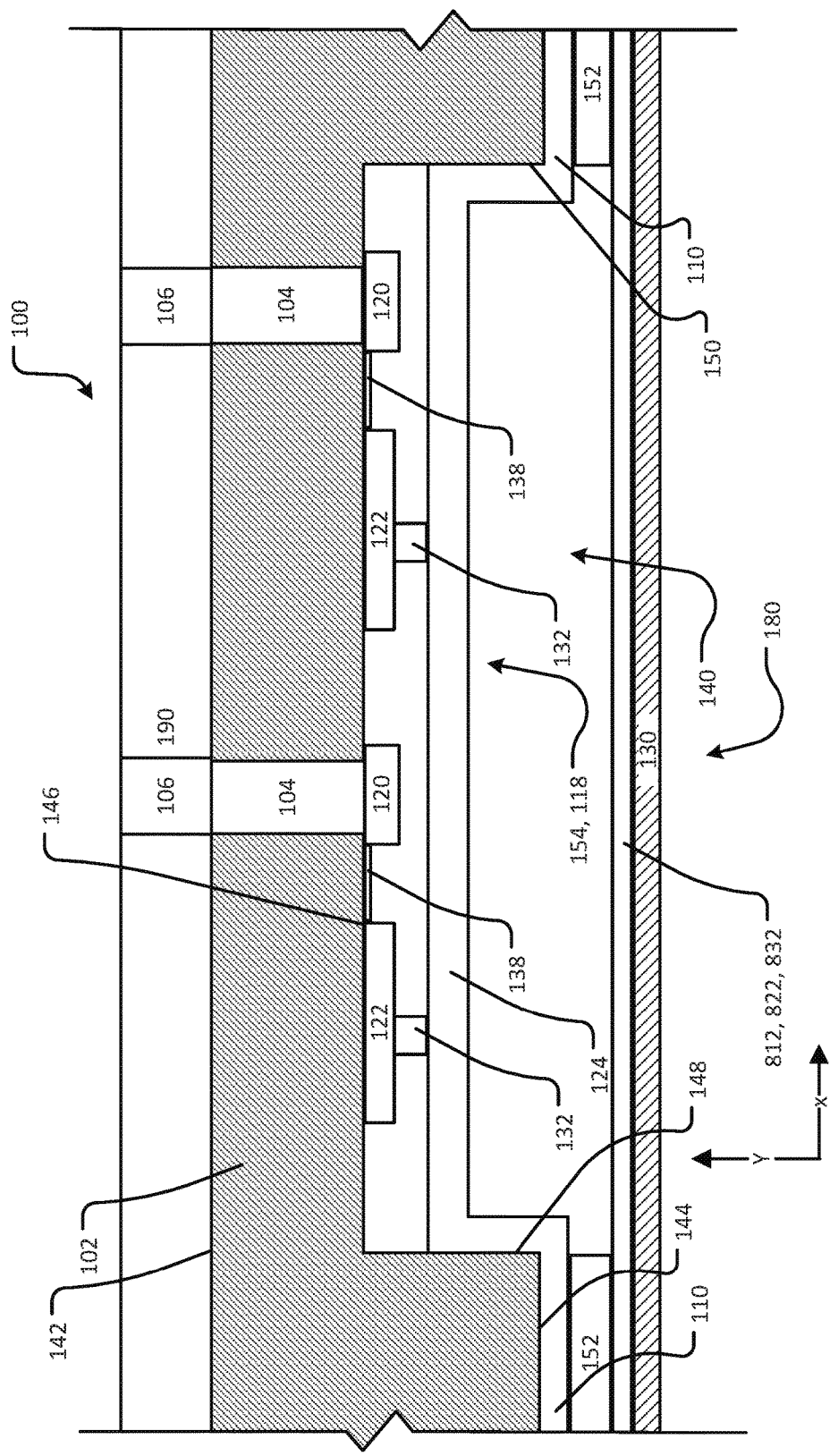
FIG. 3 illustrates a partial cross-sectional view of one aspect of a semiconductor device according to the disclosure.

FIG. 3 illustrates a partial cross-sectional view of one aspect of a semiconductor device according to the disclosure.

In particular, FIG. 3 is a semiconductor device 100 that may include any one or more of the features, components, configurations, and the like of the disclosure. The semiconductor device 100 may include the one or more devices 154 implemented as at least one resistor 118. As illustrated in FIG. 3, the at least one resistor 118 includes two resistors. However, any number of resistors may be implemented. The at least one resistor 118 may include a resistive element 138, a first resistor connection 120, a second resistor connection 122, and a third resistor connection 132. The at least one resistor 118 may be implemented as a passive two-terminal electrical component that implements electrical resistance. The at least one resistor 118 may be used to reduce current flow, adjust signal levels, divide voltages, bias active elements, terminate transmission lines, and the like.

The first resistor connection 120 may connect to one of the one or more connections 104 as illustrated in FIG. 3 and the connection may form a terminal to the resistive element 138. The second resistor connection 122 may connect to the third resistor connection 132 and to the resistive element 138 as illustrated in FIG. 3 and the connection may form a terminal to the resistive element 138. The third resistor connection 132 may connect to the electrical connection 124. However, the at least one resistor 118 may be implemented with other constructions.

Figure 4:
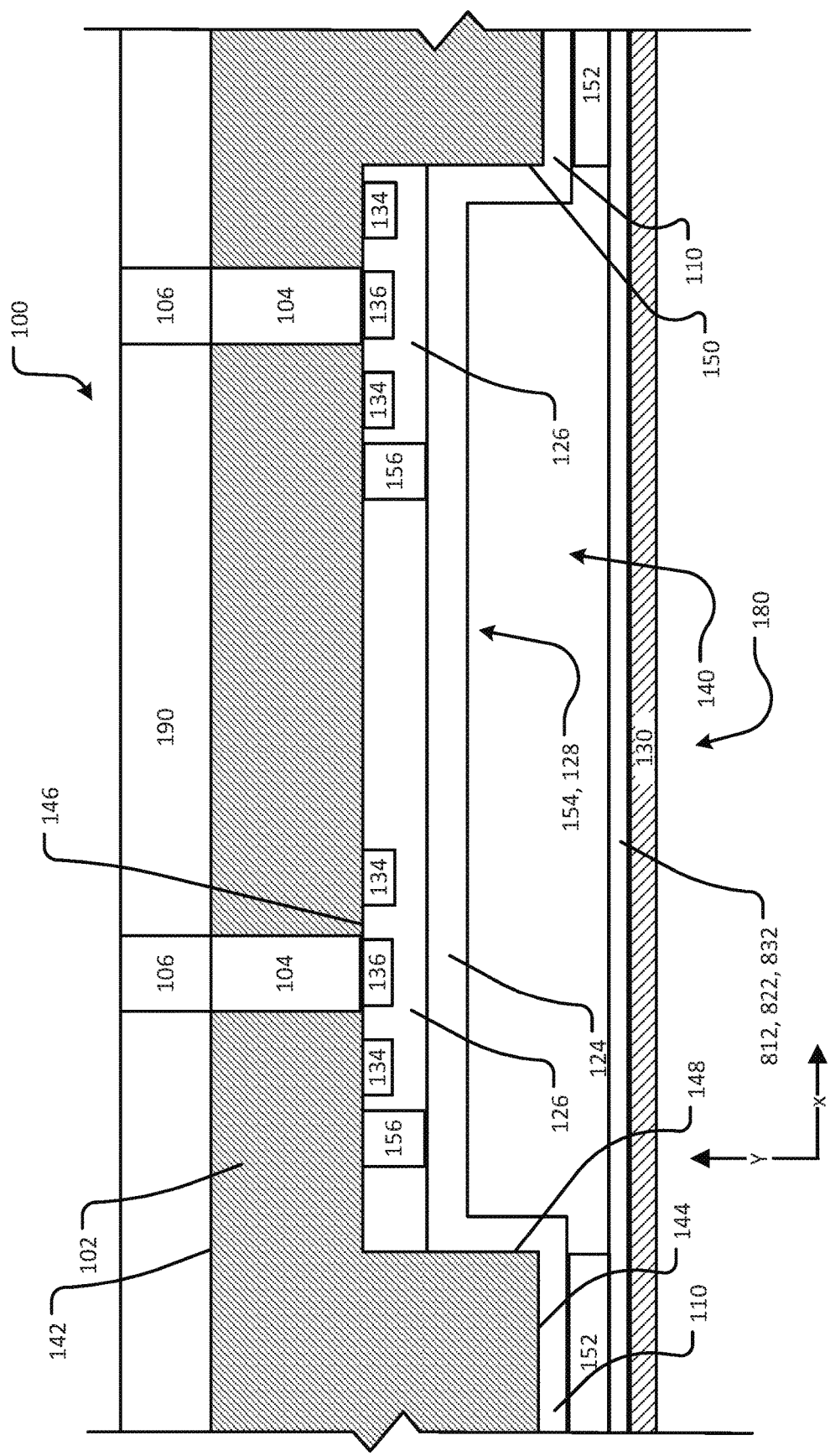
FIG. 4 illustrates a partial cross-sectional view of one aspect of a semiconductor device according to the disclosure.

FIG. 4 illustrates a partial cross-sectional view of one aspect of a semiconductor device according to the disclosure.

In particular, FIG. 4 is a semiconductor device 100 that may include any one or more of the features, components, configurations, and the like of the disclosure. The semiconductor device 100 may include the one or more devices 154 implemented as at least one inductor 128. As illustrated in FIG. 4, the at least one inductor 128 includes two inductors. However, any number of inductors may be implemented. The at least one inductor 128 may include an inductor portion 134, a first inductor connector 136, and a second inductor connector 156. The at least one inductor 128 may be implemented as a passive two-terminal electrical component that stores energy in a magnetic field when electric current flows therethrough. The inductor portion 134 may be implemented as a wire or other metallic construction wound into a coil or the like. The inductor portion 134 that is illustrated in FIG. 4 with two portions illustrates a cross-sectional view of two portions of the coil implementation of the at least one inductor 128.

The first inductor connector 136 may connect to one of the one or more connections 104 as illustrated in FIG. 4 and further connects to one end of the inductor portion 134 to form a terminal to the inductor portion 134. The second inductor connector 156 may connect to another end of the inductor portion 134 and the connection may form a terminal to the inductor portion 134. The second inductor connector 156 may connect to the electrical connection 124. However, the at least one inductor 128 may be implemented with other constructions.

Figure 5:
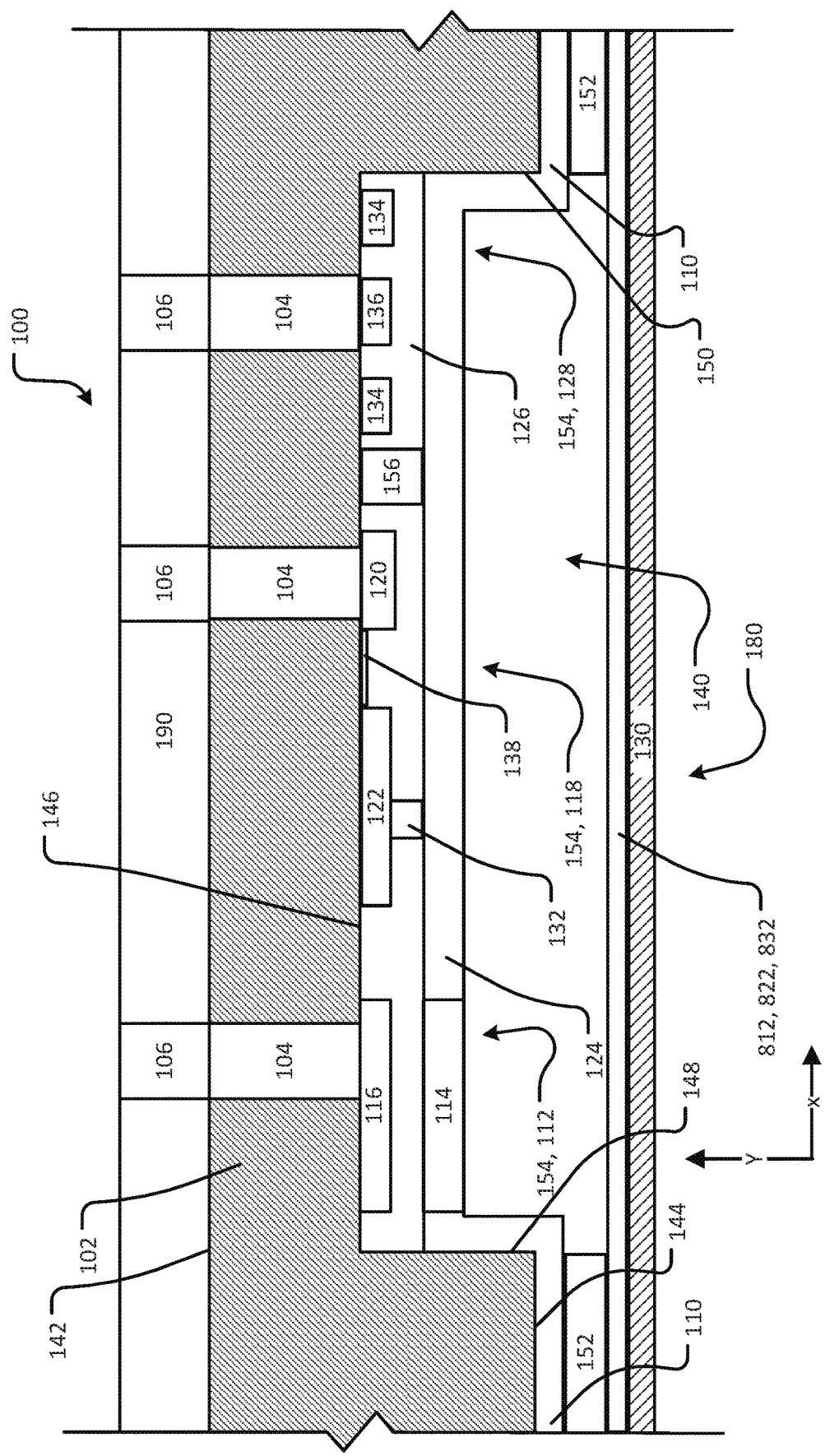
FIG. 5 illustrates a partial cross-sectional view of one aspect of a semiconductor device according to the disclosure.

FIG. 5 illustrates a partial cross-sectional view of one aspect of a semiconductor device according to the disclosure.

In particular, FIG. 5 is a semiconductor device 100 that may include any one or more of the features, components, configurations, and the like of the disclosure. The semiconductor device 100 may include the one or more devices 154 implemented as the at least one capacitor 112 as described herein; the semiconductor device 100 may include the one or more devices 154 implemented as the at least one resistor 118 as described herein; and the semiconductor device 100 may include the one or more devices 154 implemented as the at least one inductor 128 as described herein. In this regard, the semiconductor device 100 may include the one or more devices 154 implemented as any number of the at least one capacitor 112, any number of at least one resistor 118, and any number of the at least one inductor 128.

FIG. 6 illustrates a bottom view of one aspect of a semiconductor device according to the disclosure.

In particular, FIG. 6 is a semiconductor device 100 that may include any one or more of the features, components, configurations, and the like of the disclosure. In particular, FIG. 6 illustrates a bottom view or back side view of the semiconductor device 100 and the semiconductor device 100 may have a plurality of the one or more devices 154 arranged along the x-axis, a plurality of the back side cavity 140 arranged along the x-axis, a plurality of the portion 152 arranged along the x-axis, a plurality of the other components arranged along the x-axis has described herein and illustrated in FIG. 1, FIG. 2, FIG. 3, FIG. 4, and FIG. 5, and the like; and the semiconductor device 100 may have a plurality of the one or more devices 154 arranged along the z-axis, a plurality of the back side cavity 140 arranged along the z-axis, a plurality of the portion 152 arranged along the z-axis, a plurality of the other components arranged along the z-axis as described herein and illustrated in FIG. 1, FIG. 2, FIG. 3, FIG. 4, and FIG. 5, and the like.

The number of the one or more devices 154, the number of the back side cavity 140, the number of the portion 152 illustrated in FIG. 6 is merely exemplary. In this regard, any number of the one or more devices 154 may be implemented as needed in the semiconductor device 100. Moreover, any number of the one or more devices 154 may be implemented as needed in the back side cavity 140. In one aspect, there may be M number of the one or more devices 154, where M is a positive integer. Likewise, any number of the back side cavity 140 may be implemented as needed in the semiconductor device 100. In one aspect, there may be Q number of the back side cavity 140, where Q is a positive integer. Likewise, any number of the portion 152 may be implemented as needed in the semiconductor device 100. In one aspect, there may be R number of the portion 152, where R is a positive integer. The numbers M, Q, and R may be equal or may be different. In particular, only a single one of the one or more devices 154 is illustrated for each of the back side cavity 140 for ease of illustration and understanding. However, any number of the one or more devices 154 may be implemented for each of the back side cavity 140. In this regard, each of the back side cavity 140 may have the same number of the one or more devices 154 or may have a different number of the one or more devices 154. However, the back side cavity 140 described herein may be utilized in various different types of dies, die orientations, and/or other implementations of the semiconductor device 100.

Figure 7:
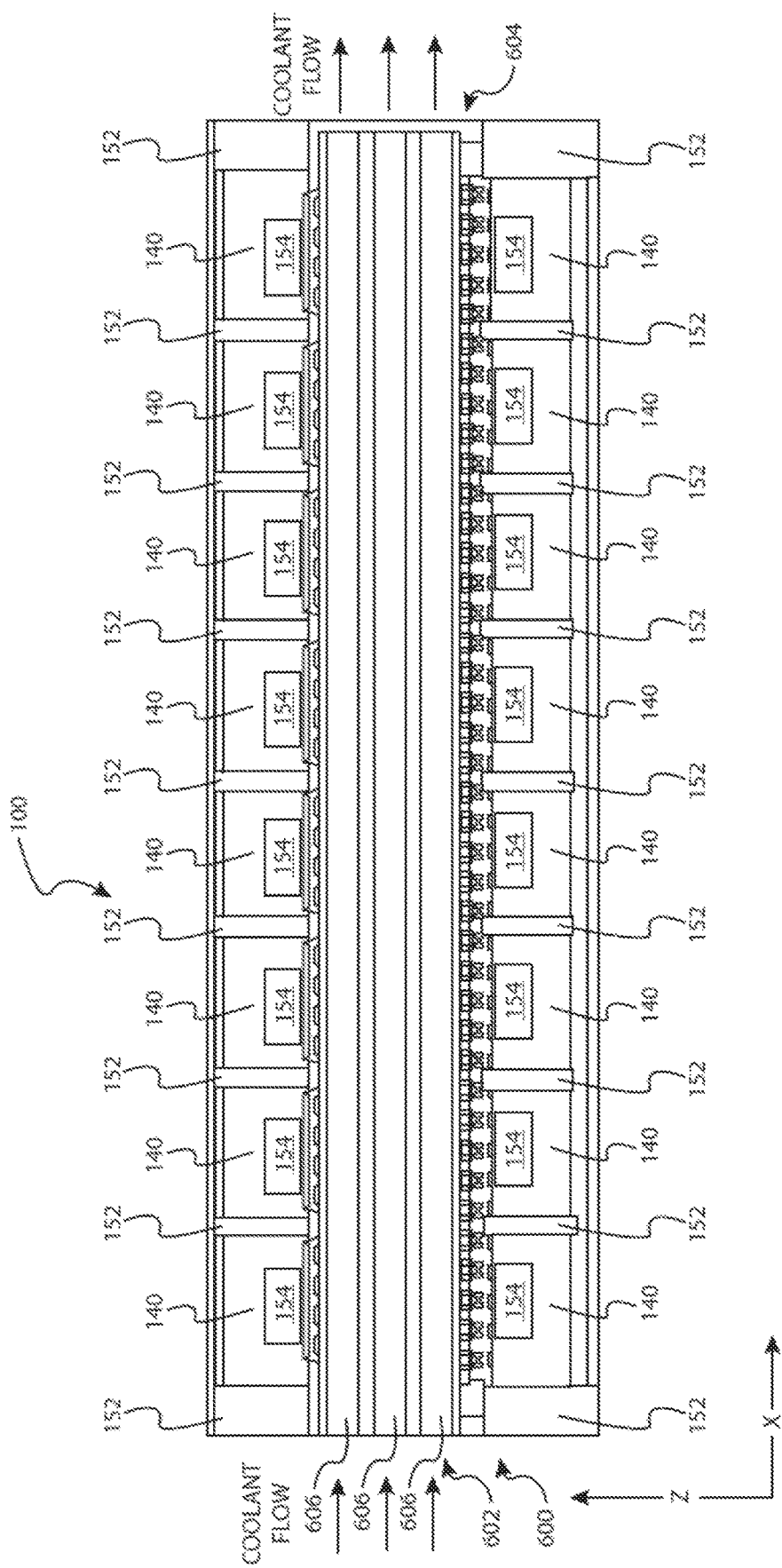
FIG. 7 illustrates a bottom view of one aspect of a semiconductor device according to the disclosure.

FIG. 7 illustrates a bottom view of one aspect of a semiconductor device according to the disclosure.

Figure 8:
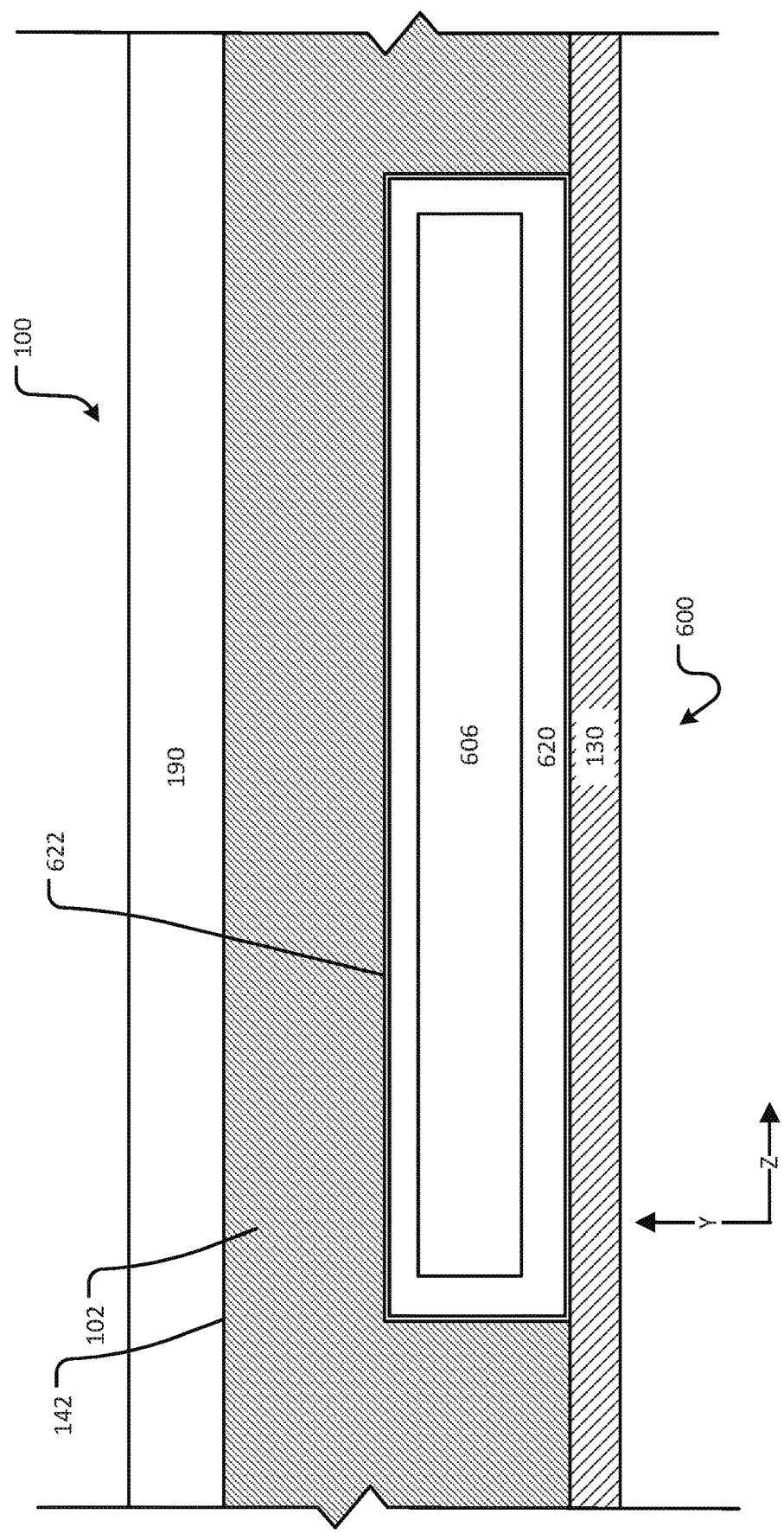
FIG. 8 illustrates a partial cross-sectional view of the semiconductor device according to FIG. 7.

FIG. 8 illustrates a partial cross-sectional view of the semiconductor device according to FIG. 7.

In particular, FIG. 7 is a semiconductor device 100 that may include any one or more of the features, components, configurations, and the like of the disclosure. In particular, FIG. 7 illustrates a bottom view or back side view of the semiconductor device 100 and the semiconductor device 100 may have a plurality of the one or more devices 154 arranged along the x-axis, a plurality of the back side cavity 140 arranged along the x-axis, a plurality of the portion 152 arranged along the x-axis, a plurality of the other components arranged along the x-axis has described herein and illustrated in FIG. 1, FIG. 2, FIG. 3, and FIG. 4, and the like; and the semiconductor device 100 may have a plurality of the one or more devices 154 arranged along the z-axis, a plurality of the back side cavity 140 arranged along the z-axis, a plurality of the portion 152 arranged along the z-axis, a plurality of the other components arranged along the z-axis as described herein and illustrated in FIG. 1, FIG. 2, FIG. 3, and FIG. 4, and the like.

Additionally, the semiconductor device 100 may implement a cooling system 600. In this regard, due to the generation of heat by the semiconductor device 100 and other components, a thermal performance of the semiconductor device 100 may be improved with the cooling system 600 of the disclosure that may be configured for maximizing heat flux, reducing system size, reducing cost, and the like. By cooling the semiconductor device 100, a greater amount of heat flux can be processed in the semiconductor device 100 and associated structure.

In one aspect, the cooling system 600 of the semiconductor device 100 may utilize the back side cavity 140. In one aspect, the back side cavity 140 may be arranged in the substrate 102 of the semiconductor device 100 as described herein. In one aspect, the back side cavity 140 may be configured for transferring heat from one or more components of the semiconductor device 100 with a coolant or a cooling medium.

In one aspect, the back side cavity 140 may be configured for guiding the coolant or the cooling medium through the semiconductor device 100 and/or the substrate 102 for cooling of one or more components of the semiconductor device 100. In one aspect, the back side cavity 140 may be configured for cooling one or more components of the semiconductor device 100. In one aspect, the cooling system 600 of the semiconductor device 100 may include the coolant or the cooling medium. In one aspect, the coolant or the cooling medium may be configured for transferring heat from the substrate 102.

In one aspect, the cooling system 600 of the semiconductor device 100 may include one or more channels 606. In one aspect, the one or more channels 606 may be arranged in the substrate 102 of the semiconductor device 100. In one aspect, the one or more channels 606 may be etched in the substrate 102 of the semiconductor device 100.

In one aspect, the one or more channels 606 may be configured for transferring heat from one or more components of the semiconductor device 100 with a coolant or a cooling medium. In one aspect, the one or more channels 606 may be configured for guiding the coolant or the cooling medium through the semiconductor device 100 and/or the substrate 102 for cooling of one or more components of the semiconductor device 100. In one aspect, the one or more channels 606 may be configured for cooling of one or more components of the semiconductor device 100.

In one aspect, the one or more channels 606 may be configured for allowing the coolant or the cooling medium to pass through the one or more channels 606. In one aspect, the semiconductor device 100 or other structure may have fluid connections that may be configured to receive a cooling fluid source and/or deliver cooling fluid for cooling purposes in association with the cooling system 600. In one aspect, the fluid connections may include threaded fittings, flanged fittings, quick connect fittings, hose barb fittings, soldered tubes, welded tubes, and the like. In one aspect, the cooling system 600 may have inlet ports 602, outlet ports 604, additional fluid channels, a pump, and/or the like that may be configured to distribute fluid flow to the one or more channels 606 of the semiconductor device 100. The cooling system 600 may further include other considerations for mounting and sealing the cooling system 600 as well to mount the cooling system 600 assembly itself to another structure in an application.

As illustrated in FIG. 8, one of the one or more channels 606 is illustrated. The one or more channels 606 may be arranged in a back side cavity 622 of the substrate 102. The back side cavity 622 may be defined by a lower surface of the substrate 102, an intermediate surface of the substrate 102, a first inner side surface of the substrate 102, and/or a second inner side surface of the substrate 102 in a manner consistent with at least FIG. 1.

Additionally, one or more sealing or insulating layers 620 may be formed on one or more of the lower surface of the substrate 102, the intermediate surface of the substrate 102, the first inner side surface of the substrate 102, the second inner side surface of the substrate 102, and/or the support 130. The one or more sealing or insulating layers in 620 may be configured to contain the coolant or the cooling medium that flows through the one or more channels 606. Other constructions for ensuring containment of the coolant or the cooling medium that flows through the one or more channels 606 are contemplated as well. In further aspects, the one or more channels 606 may be arranged in a back side cavity 140 of the substrate 102 in implementations consistent with FIG. 1.

Figure 9:
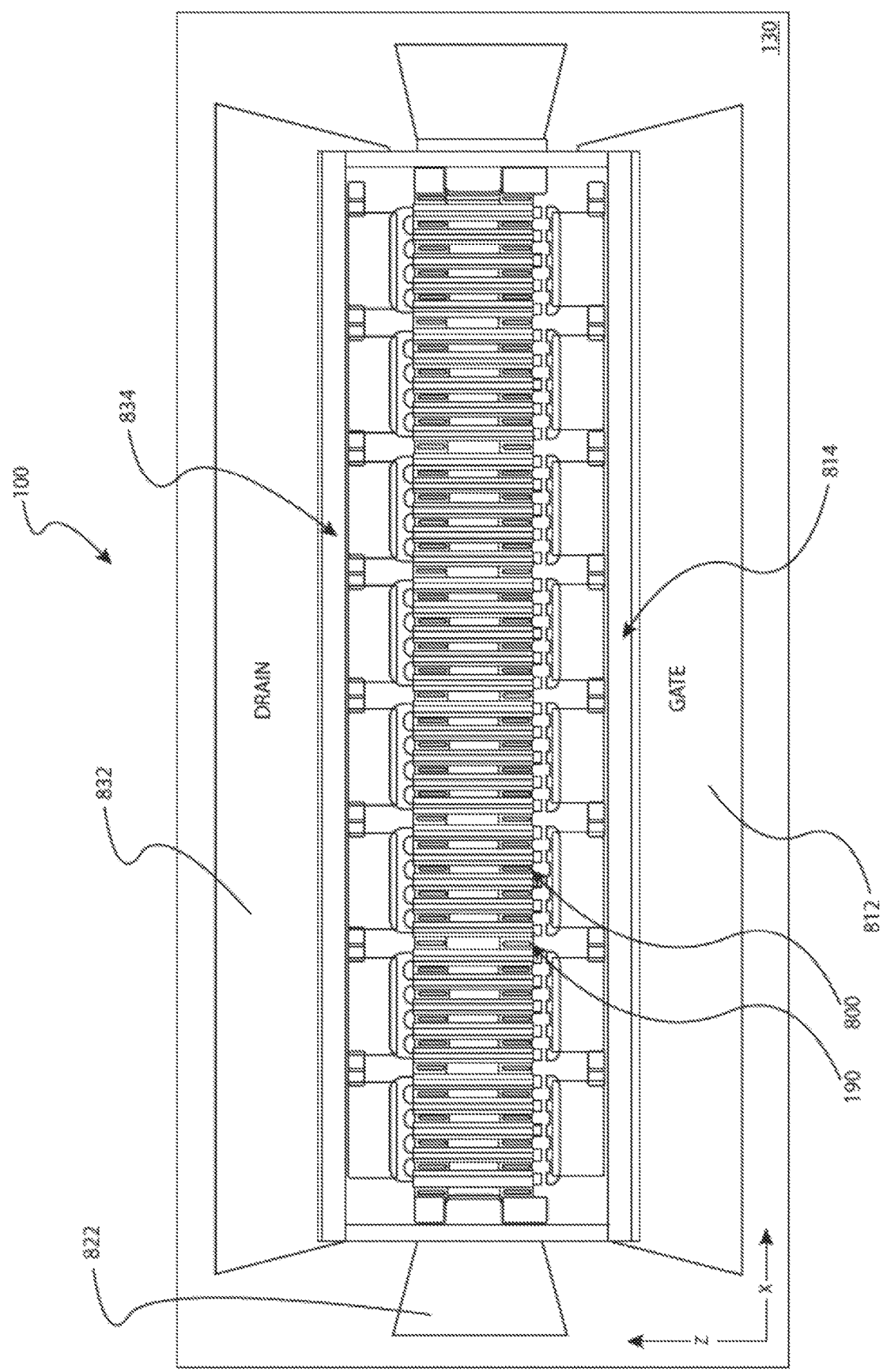
FIG. 9 illustrates a top view of one aspect of a semiconductor device according to the disclosure.

FIG. 9 illustrates a top view of one aspect of a semiconductor device according to the disclosure.

In particular, FIG. 9 is a semiconductor device 100 that may include any one or more of the features, components, configurations, and the like of the disclosure. In this regard, FIG. 9 illustrates an exemplary layout of the active region portion 190 of the semiconductor device 100. The active region portion 190 of the semiconductor device 100 may include a plurality of unit cell transistors 800. The active region portion 190 of the semiconductor device 100 may include one or more terminal connections. In one aspect, the active region portion 190 of the semiconductor device 100 may include three terminal connections. In one aspect, the active region portion 190 of the semiconductor device 100 may include a gate pad 812, a source pad 822, a drain pad 832, and/or the like on the support 130 and/or the substrate 102. In this regard, FIG. 9 is a plan view of the semiconductor device 100 (i.e., looking down at the device from above) that illustrates various contact structures of the semiconductor device 100 that are formed on the underlying structures such as the support 130 and/or the substrate 102.

As shown in FIG. 9, in the semiconductor device 100, the gate pad 812 may be connected by a gate bus 814 to a plurality of gate fingers that extend in parallel in a first direction (e.g., a long busy access as illustrated in FIG. 9) to each transistor of the plurality of unit cell transistors 800. The drain pad 832 may be connected to a plurality of drain contacts via a drain bus 834 to each transistor of the plurality of unit cell transistors 800. The source pad 822 may be connected to a plurality of parallel source contacts via a source bus to each transistor of the plurality of unit cell transistors 800 that may be disposed at a different metallization layer (here a higher metallization layer that runs above the gate fingers and the drain contacts). Vertically-extending (i.e., extending in a Y-direction that is perpendicular to the x-axis and the z-axis) source contact plugs may electrically connect each source contact of each transistor of the plurality of unit cell transistors 800 to the source bus. Each gate finger may run along the z-direction between a pair of adjacent source and drain contacts. A unit cell transistor of the plurality of unit cell transistors 800 of the semiconductor device 100 may include a gate finger that extends between adjacent source and drain contacts.

Figure 10:
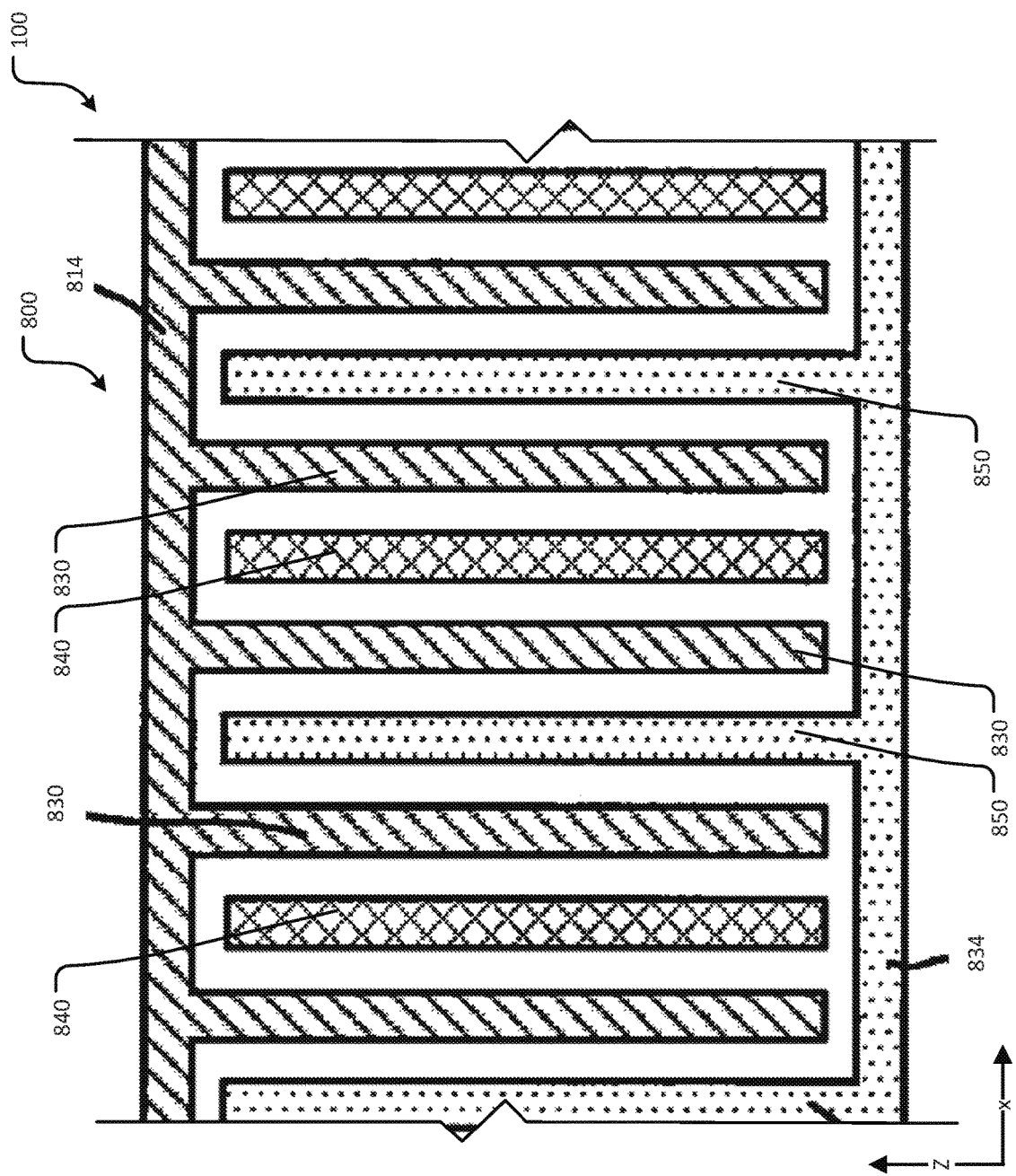
FIG. 10 illustrates a detailed partial top view of one aspect of a semiconductor device according to FIG. 9.

FIG. 10 illustrates a detailed partial top view of one aspect of a semiconductor device according to FIG. 9.

In particular, FIG. 10 illustrates details of the unit cell transistors 800. The unit cell transistors 800 may include a plurality of gate fingers 830, a plurality of source fingers 840, and a plurality of drain fingers 850 that are formed on the substrate 102. The gate fingers 830 may be spaced apart from each other along the x-axis and extend along the z-axis. The gate fingers 830 may be electrically connected to each other through a gate mandrel and/or gate bus 814.

The source fingers 840 may be spaced apart from each other along the x-axis and extend along the z-axis. The source fingers 840 may be electrically connected to each other through vias or other structures and may be electrically connected to the source pad 822.

The drain fingers 850 may likewise be spaced apart from each other along the x-axis, extend along the z-axis, and may be electrically connected to each other through a drain mandrel or the drain bus 834. Each gate finger 830 may extend in along the z-axis between a pair of adjacent source fingers 840 and drain fingers 850. The gate fingers 830, the source fingers 840, and the drain fingers 850 may each include a conductive material, such as a metal or a metal alloy.

As further illustrated in FIG. 10, the source fingers 840 and the drain fingers 850 may be arranged on opposed sides of the gate fingers 830. In aspects, one or more of the source fingers 840 and/or the drain fingers 850, as well as source regions and/or drain regions may be shared by two adjacent gate fingers 830.

Figure 11:
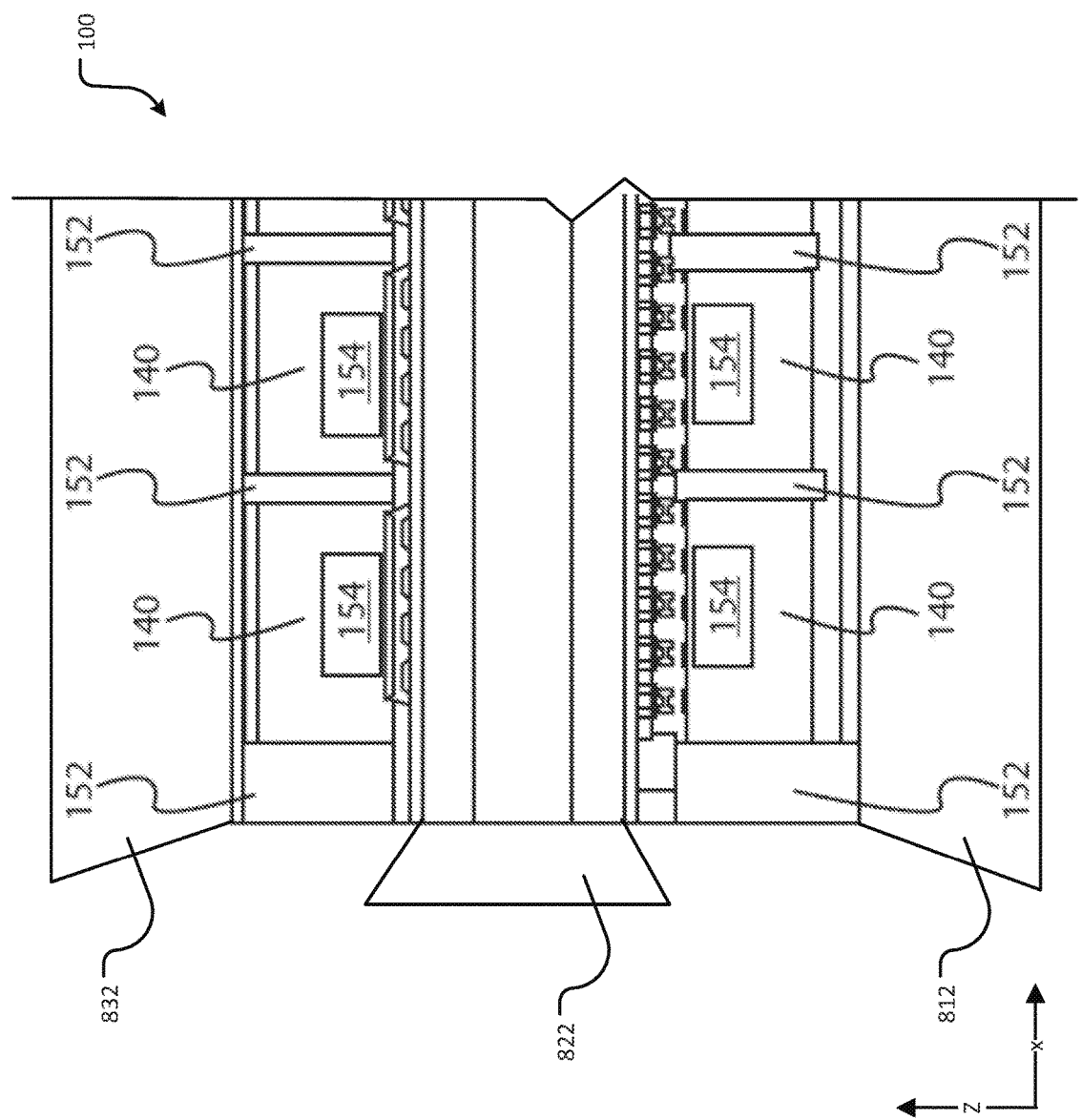
FIG. 11 illustrates a partial bottom view of one aspect of a semiconductor device according to FIG. 9.

FIG. 11 illustrates a partial bottom view of one aspect of a semiconductor device according to FIG. 9.

In particular, FIG. 11 illustrates a partial bottom view or back side view of the semiconductor device 100 implementing the one or more devices 154, the plurality of the back side cavity 140, and the plurality of the portion 152. Additionally, FIG. 11 illustrates the arrangement and location of the gate pad 812, the source pad 822, and the drain pad 832 with respect to the one or more devices 154, the plurality of the back side cavity 140, and the plurality of the portion 152.

Figure 12:
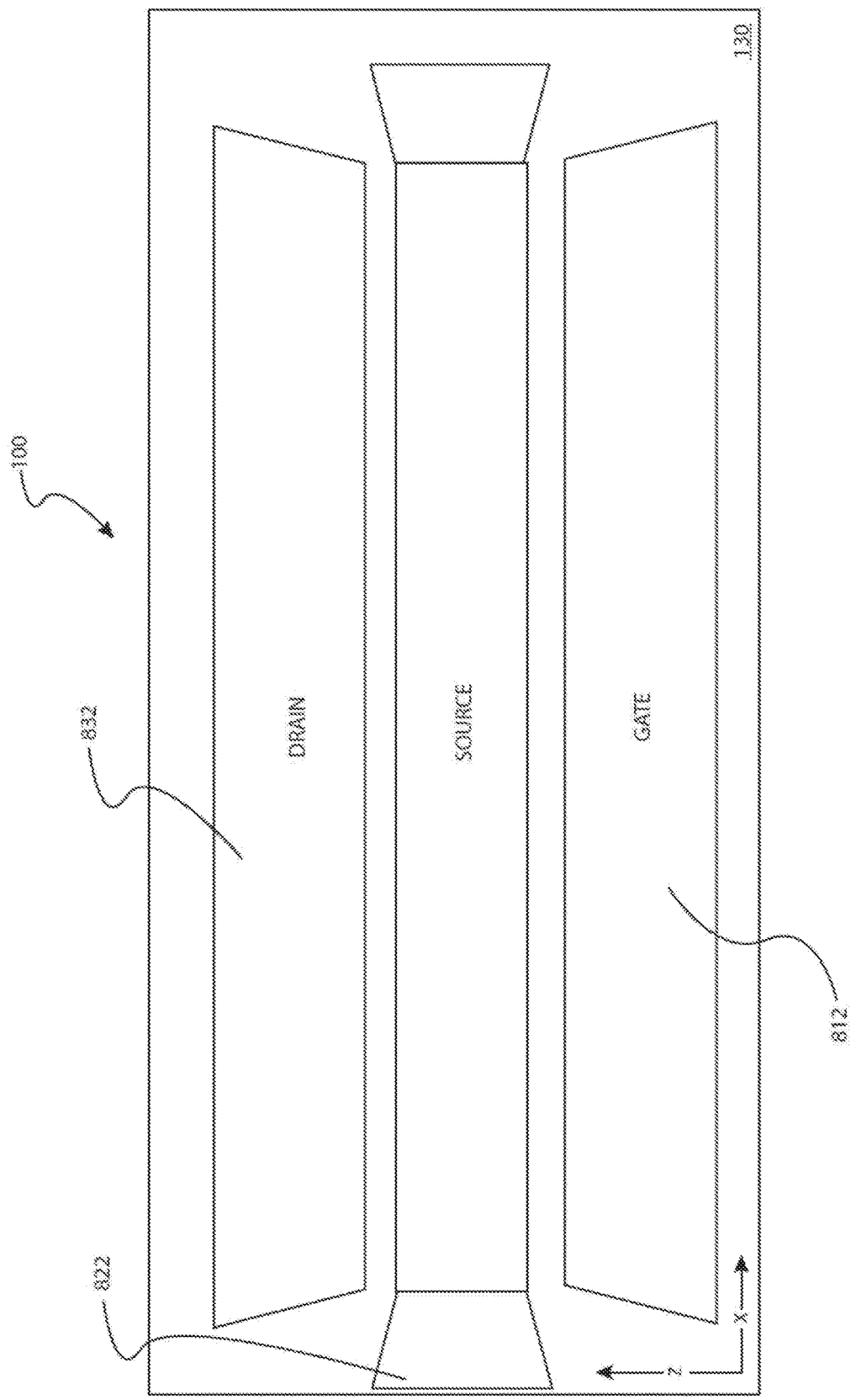
FIG. 12 illustrates a top view of one aspect of a semiconductor device according to FIG. 9.

FIG. 12 illustrates a top view of one aspect of a semiconductor device according to the disclosure.

In particular, FIG. 12 is a semiconductor device 100 that may include any one or more of the features, components, configurations, and the like of the disclosure. In this regard, FIG. 12 illustrates an exemplary layout of one or more terminal connections that may be arranged on the support 130. In one aspect, the semiconductor device 100 may include three terminal connections that may be arranged on the support 130. In one aspect, the semiconductor device 100 may include the gate pad 812, the source pad 822, the drain pad 832, and/or the like that may be arranged on the support 130.

Figure 13:
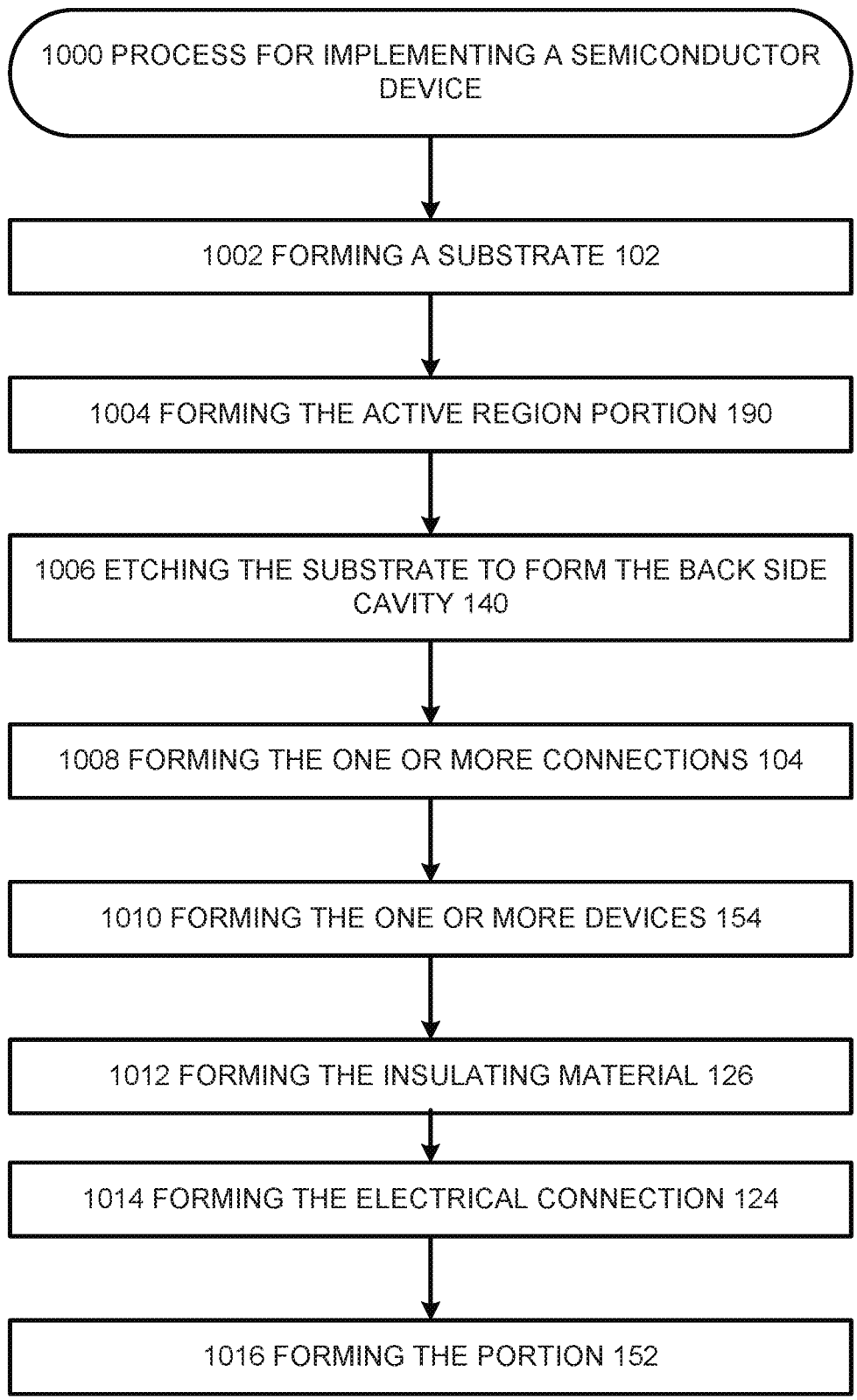
FIG. 13 illustrates a process of implementing a semiconductor device according to the disclosure.

FIG. 13 illustrates a process of implementing a semiconductor device according to the disclosure.

In particular, FIG. 13 illustrates an exemplary process for implementing a semiconductor device 1000, which may be a process for implementing the semiconductor device 100 of the disclosure. It should be noted that the process for implementing the semiconductor device 1000 is merely exemplary and may be modified consistent with the various aspects disclosed herein.

It should be noted that the aspects of process 1000 may be performed in a different order consistent with the aspects described above. Additionally, it should be noted that portions of the process 1000 may be performed in a different order consistent with the aspects described above. Moreover, the process 1000 may be modified to have more or fewer processes consistent with the various aspects disclosed herein.

As illustrated in box 1002, the process for implementing a semiconductor device 1000 may include forming a substrate 102. The substrate 102 may be made of Silicon Carbide (SiC). In some aspects, the substrate 102 may be a semi-insulating SiC substrate, a p-type substrate, an n-type substrate, and/or the like. In some aspects, the substrate 102 may be very lightly doped. In one aspect, the background impurity levels may be low. In one aspect, the background impurity levels may be $1E15/cm^3$ or less. The substrate 102 may be formed of SiC selected from the group of 6H, 4H, 15R, 3C SiC, or the like. In another aspect, the substrate 102 may be GaAs, GaN, or other material suitable for the applications described herein. In another aspect, the substrate 102 may include spinel, ZnO, silicon, or any other material capable of supporting growth of Group III-nitride materials. Additionally, the above-noted process may include any other aspects consistent with the disclosure.

As illustrated in box 1004 the process for implementing a semiconductor device 1000 may include forming the active region portion 190. In particular, the active region portion 190 may be formed on the substrate 102 as one or more power amplifier transistors, single path radio frequency (RF) power transistors, single stage radio frequency (RF) power transistors, multipath radio frequency (RF) power transistors, multistage radio frequency (RF) power transistors, gallium nitride (GaN) based radio frequency (RF) power amplifier modules, laterally-diffused metal-oxide semiconductor (LDMOS) devices, LDMOS radio frequency (RF) power amplifier modules, radio frequency (RF) power devices, ultra-wideband devices, GaN based devices, Metal Semiconductor Field-Effect Transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) semiconductors, and/or the like. Additionally, the above-noted process may include any other aspects consistent with the disclosure. Additionally, forming the active region portion 190 may include multiple process steps that may be implemented throughout the process illustrated in FIG. 13.

In one aspect, the active region portion 190 may be implemented as a transistor. In one aspect, the active region portion 190 may be implemented as a transistor that may be implemented as a HEMT and may include the substrate 102. In one aspect, the semiconductor device 100 and/or the active region portion 190 may be implemented as a transistor having a plurality of unit cell transistors 800. Accordingly, forming the active region portion 190 may include at least forming a buffer layer on the substrate 102, forming a barrier layer arranged on the buffer layer, and the like.

As illustrated in box 1006 the process for implementing a semiconductor device 1000 may include etching the substrate 102 to form the back side cavity 140. In one aspect, the substrate 102 may be partially etched to form the back side cavity 140. In one aspect, the etching process may include photo-lithography processes, processes that implement photo-lithographic masks, and the like etching processes.

Additionally, the process for implementing a semiconductor device 1000 may include etching the substrate 102 to form the one or more channels 606. In one aspect, the substrate 102 may be partially etched to form the one or more channels 606. In one aspect, the etching process may include photo-lithography processes, processes that implement photo-lithographic masks, and the like etching processes.

For example, the etching processes may include a masking material which resists etching. The masking material may be a photoresist which has been patterned using photolithography. The etching processes may include one or more of wet etching, anisotropic wet etching, plasma etching, and the like. Additionally, the above-noted process may include any other aspects consistent with the disclosure.

As illustrated in box 1008 the process for implementing a semiconductor device 1000 may include forming the one or more connections 104. The one or more connections 104 may be implemented by one or more vias. The one or more vias may be fabricated and patterned to form metallic plated holes, such as copper-plated holes, aluminum-plated holes, silver-plated holes, gold-plated holes, and/or the like, that may function as electrical tunnels through the substrate 102. Additionally, forming the one or more connections 104 that may be implemented by one or more vias may include multiple process steps that may be implemented throughout the process illustrated in FIG. 13. Additionally, the one or more connections 104 may utilize other types of connection technology including one or more wires, leads, edge platings, circuit traces, tracks, clips, and/or the like. Additionally, the above-noted process may include any other aspects consistent with the disclosure.

As illustrated in box 1010 the process for implementing a semiconductor device 1000 may include forming the one or more devices 154. In particular, forming the one or more devices 154 may include one or more of forming one or more metal layers, forming one or more back side metal layers, forming one or more patterned back side metal layers, and/or the like. In particular, forming the one or more devices 154 may include forming one or more resistors, one or more capacitors, one or more inductors, one or more resistor circuits, one or more capacitor circuits, one or more inductor circuits, an integrated passive devices (IPD), Integrated Passive Components (IPC), radio frequency (RF) passive devices, impedance matching circuits, matching circuits, input matching circuits, output matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, and the like. Additionally, forming the one or more devices 154 may include multiple process steps that may be implemented throughout the process illustrated in FIG. 13. For example, forming the one or more devices 154 may include forming partial layers of the one or more devices 154 utilizing patterned back side metal layers, forming the insulating material 126 as described below, and may include forming additional partial layers of the one or more devices 154 utilizing patterned back side metal layers. Moreover, forming the one or more devices 154 may include a separate step of depositing resistor metal for the resistive element 138. Additionally, the above-noted process may include any other aspects consistent with the disclosure.

As illustrated in box 1012 the process for implementing a semiconductor device 1000 may include forming the insulating material 126. In particular, forming the insulating material 126 may include forming layers that may include SiN, AlO, SiO, SiO$_2$, AlN, or the like, or a combination incorporating multiple layers thereof. The insulating material 126 can be deposited using Metalorganic Chemical Vapor Deposition (MOCVD) processes, plasma chemical vapor deposition (CVD) processes, hot-filament CVD processes, sputtering processes, and/or the like. In one aspect, the insulating material 126 forms an insulating layer. In one aspect, the insulating material 126 forms an insulator. In one aspect, the insulating material 126 may be a dielectric. Additionally, the above-noted process may include any other aspects consistent with the disclosure.

As illustrated in box 1014 the process for implementing a semiconductor device 1000 may include forming the electrical connection 124. In particular, forming the electrical connection 124 may be formed utilizing patterned back side metal layers. Additionally, the above-noted process may include any other aspects consistent with the disclosure.

As illustrated in box 1016 the process for implementing a semiconductor device 1000 may include forming the portion 152. In particular, forming the portion 152 may include applying patterned solder metal to the semiconductor device 100. In one aspect, forming the portion 152 may include applying patterned solder metal to the substrate 102 of the semiconductor device 100. Additionally, the above-noted process may include any other aspects consistent with the disclosure.

The semiconductor device 100 and/or the active region portion 190 may be implemented as a transistor. In one aspect, the semiconductor device 100 and/or the active region portion 190 may be implemented as a transistor that may be implemented as a HEMT and may include the substrate 102. In one aspect, the semiconductor device 100 and/or the active region portion 190 may be implemented as a transistor having a plurality of unit cell transistors 800.

The semiconductor device 100 and/or the active region portion 190 implemented as a HEMT may include a buffer layer, a barrier layer arranged on the buffer layer. On the substrate 102, a buffer layer, and/or a nucleation layer, may be formed. In one aspect, the buffer layer is formed on the substrate 102. In one aspect, a bandgap of the buffer layer may be less than a bandgap of the barrier layer to form a two-dimensional electron gas (2DEG) at a heterointerface between the buffer layer and barrier layer when biased at an appropriate level. In one aspect, the buffer layer is a Group III-nitride material, such as GaN, and the barrier layer is a Group III-nitride material, such as AlGaN or AlN. In some aspects, there may be intervening layer(s) or region(s) between the substrate 102 and the buffer layer, such as a nucleation layer.

As used herein, the term "Group III-nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN, and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds.

Semiconductor devices such as Group III-nitride based high-electron mobility transistors (HEMTs) are very promising candidates for high power amplifiers, radiofrequency (RF) applications, and also for low frequency high power switching applications since the material properties of Group III-nitrides, such as gallium nitride (GaN) and its alloys enable achievement of high voltage and high current along with high radio frequency (RF) gain and linearity for radio frequency (RF) applications. A typical Group III-nitride HEMT comprises a substrate, a Group III-nitride (e.g., GaN) buffer or channel layer formed on the substrate, and a higher band-gap Group III-nitride (e.g., AlGaN) layer formed on the buffer or channel layer. Respective source, drain, and gate contacts are electrically coupled to the barrier layer. The HEMT relies on a two-dimensional electron gas (2DEG) formed at an interface between the higher band-gap barrier layer and the lower bandgap buffer or channel layer, where the lower bandgap material has a higher electron affinity. The 2DEG is an accumulation layer in the lower bandgap material and can contain a high electron concentration and high electron mobility. HEMTs fabricated in the Group III-nitride material system have the potential to generate large amounts of radio frequency (RF) power because of the combination of material characteristics that includes high breakdown fields, wide bandgaps, large conduction band offset, and/or high saturated electron drift velocity.

In particular aspects, the semiconductor device 100 of the disclosure may be utilized in amplifiers. In further aspects, the semiconductor device 100 of the disclosure may be utilized in wireless base stations that connect to a wireless device. In further aspects, the semiconductor device 100 of the disclosure may be utilized in amplifiers implemented by wireless base stations that connect to a wireless device. In further aspects, the semiconductor device 100 of the disclosure may be utilized in in wireless devices. In further aspects, the semiconductor device 100 of the disclosure may be utilized in amplifiers implemented in wireless devices. In particular aspects, the semiconductor device 100 of the disclosure may be utilized in amplifiers or other components implemented in General-Purpose Broadband components, Telecom components, L-Band components, S-Band components, X-Band components, C-Band components, K band components, Ku-Band components, Satellite Communication components, and/or the like In particular aspects, the semiconductor device 100 of the disclosure may be utilized in wireless base stations that connect to a wireless device. In further aspects, the semiconductor device 100 of the disclosure may be utilized in amplifiers implemented by wireless base stations that connect to a wireless device. In further aspects, the semiconductor device 100 of the disclosure may be utilized in wireless devices. In further aspects, the semiconductor device 100 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A semiconductor device configured for a radio frequency (RF) application comprising:
   a substrate configured to support growth of semiconductor layers and the substrate comprising at least a lower surface, an inner side surface, and an intermediate surface;
   an active region portion comprising the substrate and the semiconductor layers and the semiconductor layers of the active region portion being arranged on the substrate, the active region portion comprising at least one radio frequency (RF) transistor amplifier;
   a cavity structured and arranged within the substrate; and
   one or more radio frequency (RF) devices arranged in the cavity,
   wherein the inner side surface of the substrate extends from the intermediate surface of the substrate to the lower surface of the substrate; and
   wherein at least the inner side surface of the substrate and the intermediate surface of the substrate are configured and structured to define and form the cavity in the substrate.

2. The semiconductor device of claim 1
   wherein the one or more radio frequency (RF) devices are arranged on the intermediate surface of the substrate and the one or more radio frequency (RF) devices are arranged in the cavity in the substrate; and
   wherein the one or more radio frequency (RF) devices are configured to be implemented as at least one of the following: one or more resistors, one or more capacitors, one or more inductors, one or more resistor circuits, one or more capacitor circuits, and one or more inductor circuits.

3. The semiconductor device of claim 1 further comprising:
   an electrical path that extends from the one or more radio frequency (RF) devices through the substrate to the active region portion; and
   at least one connection to the active region portion,
   wherein the electrical path comprises one or more vias; and
   wherein the at least one connection extends along the lower surface of the substrate and the inner side surface within the cavity to the one or more radio frequency (RF) devices.

4. The semiconductor device of claim 1 further comprising:
   an electrical path that extends from the one or more radio frequency (RF) devices through the substrate to the active region portion; and
   an insulating material arranged between the intermediate surface and the electrical path,
   wherein the one or more radio frequency (RF) devices are at least partially covered by the insulating material.

5. The semiconductor device of claim 1 wherein:
   the substrate comprises silicon carbide (SiC);
   the semiconductor layers comprise at least a buffer layer arranged on the substrate; and
   the active region portion comprises at least one high-electron-mobility transistor (HEMT).

6. The semiconductor device of claim 1 wherein the cavity comprises a plurality of the cavity formed and defined in one or more of portions of the substrate.

7. The semiconductor device of claim 1 wherein the cavity is structured as an etched back side cavity in the substrate.

8. The semiconductor device of claim 1 further comprising:
   a support; and
   an electrical path that extends from the one or more radio frequency (RF) devices through the substrate to the active region portion,
   wherein the electrical path provides an electrical connection between the one or more radio frequency (RF) devices and the support.

9. The semiconductor device of claim 8 wherein:
   the substrate is mounted on an upper surface of the support; and
   the support is implemented as a printed circuit board (PCB).

10. The semiconductor device of claim 1 further comprising an electrical path that extends from the one or more radio frequency (RF) devices through the substrate to the active region portion,
    wherein the electrical path comprises one or more vias; and
    wherein the one or more radio frequency (RF) devices are configured to be implemented as at least one of the following: one or more resistors, one or more capacitors, one or more inductors, one or more resistor circuits, one or more capacitor circuits, and one or more inductor circuits.

11. The semiconductor device of claim 1 wherein:
    the cavity is structured as an etched back side cavity in the substrate;
    the substrate comprises silicon carbide (SiC);
    the semiconductor layers comprise at least a buffer layer arranged on the substrate; and
    the active region portion comprises at least one high-electron-mobility transistor (HEMT).

12. A semiconductor device configured for a radio frequency (RF) application comprising:

a substrate configured to support growth of semiconductor layers;

an active region portion comprising the substrate and the semiconductor layers and the semiconductor layers of the active region portion being arranged on the substrate, the active region portion comprising at least one radio frequency (RF) transistor amplifier;

a cavity structured and arranged within the substrate between inner side surfaces of the substrate and an intermediate surface of the substrate; and one or more radio frequency (RF) devices arranged in the cavity, wherein the inner side surfaces of the substrate are configured and structured to define and form the cavity in the substrate and extend from the intermediate surface of the substrate to a lower surface of the substrate.

13. The semiconductor device of claim 12
wherein the one or more radio frequency (RF) devices are arranged on the intermediate surface of the substrate and the one or more radio frequency (RF) devices are arranged in the cavity in the substrate; and wherein the one or more radio frequency (RF) devices are configured to be implemented as at least one of the following: one or more resistors, one or more capacitors, more inductors, one or more resistor circuits, one or more capacitor circuits, and one or more inductor circuits.

14. The semiconductor device of claim 12 further comprising:

an electrical path that extends from the one or more radio frequency (RF) devices through the substrate to the active region portion; and at least one connection to the active region portion, wherein the electrical path comprises one or more vias; and wherein the at least one connection extends along the lower surface of the substrate and the inner side surfaces within the cavity to the one or more radio frequency (RF) devices.

15. The semiconductor device of claim 12 further comprising:

an electrical path that extends from the one or more radio frequency (RF) devices through the substrate to the active region portion; and an insulating material arranged between the intermediate surface and the electrical path, wherein the one or more radio frequency (RF) devices are at least partially covered by the insulating material.

16. The semiconductor device of claim 12 wherein:
the substrate comprises silicon carbide (SiC);
the semiconductor layers comprises at least a buffer layer arranged on the substrate; and
the active region portion comprises at least one high-electron-mobility transistor (HEMT).

17. The semiconductor device of claim 12 wherein the cavity comprises a plurality of the cavity formed and defined in one or more of portions of the substrate.

18. The semiconductor device of claim 12 wherein the cavity is structured as an etched back side cavity in the substrate.

19. The semiconductor device of claim 12 further comprising:

a support; and
an electrical path that extends from the one or more radio frequency (RF) devices through the substrate to the active region portion, wherein the electrical path provides an electrical connection between the one or more radio frequency (RF) devices and the support.

20. The semiconductor device of claim 19 wherein:
the substrate is mounted on an upper surface of the support; and
the support is implemented as a printed circuit board (PCB).

21. The semiconductor device of claim 12 further comprising an electrical path that extends from the one or more radio frequency (RF) devices through the substrate to the active region portion, wherein the electrical path comprises one or more vias; and wherein the one or more radio frequency (RF) devices are configured to be implemented as at least one of the following: one or more resistors, one or more capacitors, one or more inductors, one or more resistor circuits, one or more capacitor circuits, and one or more inductor circuits.

22. The semiconductor device of claim 12 wherein:
the cavity is structured as an etched back side cavity in the substrate;
the substrate comprises silicon carbide (SiC); and
the active region portion comprises at least one high-electron-mobility transistor (HEMT).

23. A semiconductor device configured for a radio frequency (RF) application comprising:

a substrate configured to support growth of semiconductor layers;

an active region portion comprising the substrate and the semiconductor layers and the semiconductor layers of the active region portion being arranged on the substrate, the active region portion comprising at least one radio frequency (RF) transistor amplifier;

a cavity structured and arranged within the substrate between structural configurations of a lower surface of the substrate, an inner side surface of the substrate, and an intermediate surface of the substrate; and one or more radio frequency (RF) devices arranged in the cavity, wherein the inner side surface of the substrate extends from the intermediate surface of the substrate to the lower surface of the substrate.

24. The semiconductor device of claim 23
wherein the one or more radio frequency (RF) devices are arranged on the intermediate surface of the substrate and the one or more radio frequency (RF) devices are arranged in the cavity in the substrate; and wherein the one or more radio frequency (RF) devices are configured to be implemented as at least one of the following: one or more resistors, one or more capacitors, one or more inductors, one or more resistor circuits, one or more capacitor circuits, and one or more inductor circuits.

25. The semiconductor device of claim 23 further comprising:

an electrical path that extends from the one or more radio frequency (RF) devices through the substrate to the active region portion; and at least one connection to the active region portion, wherein the electrical path comprises one or more vias; and wherein the at least one connection extends along the lower surface of the substrate and the inner side surface within the cavity to the one or more radio frequency (RF) devices.

26. The semiconductor device of claim 23 further comprising:
   an electrical path that extends from the one or more radio frequency (RF) devices through the substrate to the active region portion; and
   an insulating material arranged between the intermediate surface and the electrical path,
   wherein the one or more radio frequency (RF) devices are at least partially covered by the insulating material.

27. The semiconductor device of claim 23 wherein:
   the substrate comprises silicon carbide (SiC);
   the semiconductor layers comprise at least a buffer layer arranged on the substrate; and
   the active region portion comprises at least one high-electron-mobility transistor (HEMT).

28. The semiconductor device of claim 23 wherein the cavity comprises a plurality of the cavity formed and defined in one or more of portions of the substrate.

29. The semiconductor device of claim 23 wherein the cavity is structured as an etched back side cavity in the substrate.

30. The semiconductor device of claim 23 further comprising:
   a support; and
   an electrical path that extends from the one or more radio frequency (RF) devices through the substrate to the active region portion,
   wherein the electrical path provides an electrical connection between the one or more radio frequency (RF) devices and the support.

31. The semiconductor device of claim 30 wherein:
   the substrate is mounted on an upper surface of the support; and
   the support is implemented as a printed circuit board (PCB).

32. The semiconductor device of claim 23 further comprising an electrical path that extends from the one or more radio frequency (RF) devices through the substrate to the active region portion,
   wherein the electrical path comprises one or more vias; and
   wherein the one or more radio frequency (RF) devices are configured to be implemented as at least one of the following: one or more resistors, one or more capacitors, one or more inductors, one or more resistor circuits, one or more capacitor circuits, and one or more inductor circuits.

33. The semiconductor device of claim 23 wherein:
   the cavity is structured as an etched back side cavity in the substrate;
   the substrate comprises silicon carbide (SiC);
   the semiconductor layers comprise at least a buffer layer arranged on the substrate; and
   the active region portion comprises at least one high-electron-mobility transistor (HEMT).

* * * * *